(12) United States Patent (10) Patent No.: US 7,602,213 B2
Dorairaj (45) Date of Patent: Oct. 13, 2009

(54) USING PROGRAMMABLE LATCH TO IMPLEMENT LOGIC

(75) Inventor: Nij Dorairaj, Campbell, CA (US)

(73) Assignee: Tier Logic, Inc., Santa Clara, CA (US)

( * ) Notice: Subject to any disclaimer, the term of this patent is extended or adjusted under 35 U.S.C. 154(b) by 8 days.

(21) Appl. No.: 11/964,084

(22) Filed: Dec. 26, 2007

(65) Prior Publication Data

US 2009/0167347 A1    Jul. 2, 2009

(51) Int. Cl.
*H03K 19/173* (2006.01)
(52) U.S. Cl. .......................... 326/38; 326/41
(58) Field of Classification Search ............. 326/37–41, 326/46, 112, 119, 121, 93–98
See application file for complete search history.

(56) References Cited

U.S. PATENT DOCUMENTS

| | | | |
|---|---|---|---|
| 4,609,986 | A | 9/1986 | Hartmann et al. |
| 4,706,216 | A | 11/1987 | Carter |
| 4,761,768 | A | 8/1988 | Turner et al. |
| 4,864,161 | A | 9/1989 | Norman et al. |
| 4,870,302 | A | 9/1989 | Freeman |
| 4,873,459 | A | 10/1989 | El Gamal et al. |
| 5,164,612 | A | 11/1992 | Kaplinsky |
| 5,191,241 | A | 3/1993 | McCollum et al. |
| 5,216,636 | A | 6/1993 | Runaldue |
| 5,225,719 | A * | 7/1993 | Agrawal et al. ............... 326/38 |
| 5,343,406 | A | 8/1994 | Freeman et al. |
| 5,347,519 | A | 9/1994 | Cooke et al. |
| 5,488,316 | A | 1/1996 | Freeman et al. |
| 5,563,526 | A | 10/1996 | Hastings et al. |
| 5,581,501 | A | 12/1996 | Sansbury et al. |
| 5,612,631 | A | 3/1997 | Agrawal et al. |
| 5,625,221 | A | 4/1997 | Kim et al. |
| 5,679,967 | A | 10/1997 | Janai et al. |
| 5,684,744 | A | 11/1997 | Orgill et al. |
| 5,701,233 | A | 12/1997 | Carson et al. |
| 5,781,031 | A | 7/1998 | Bertin |
| 5,793,115 | A | 8/1998 | Zavracky et al. |
| 5,835,405 | A | 11/1998 | Tsui et al. |
| 5,844,422 | A | 12/1998 | Trimberger et al. |
| 5,880,598 | A | 3/1999 | Duong |
| 5,889,411 | A * | 3/1999 | Chaudhary ................... 326/39 |

(Continued)

OTHER PUBLICATIONS

Ashok K. Sharma, "Programmable Logic Handbook—PLDs, CPLDs, & FPGAs", 1998, pp. 99-171, McGraw-Hill, USA.

(Continued)

*Primary Examiner*—Don P Le
(74) *Attorney, Agent, or Firm*—Tran & Associates

(57) ABSTRACT

A logic circuit is disclosed that includes a latch for enhancing the circuit logic capacity. The circuit includes a logic block comprising a plurality of logic inputs and at least one logic output, the logic output generating a logic function of the plurality of logic inputs; a first latch input to provide a data state to store in the latch is coupled to said at least one output of logic block; a global latch input to change the stored data state of the latch couple by a programmable method to a local input; and a latch output, wherein when the local input is coupled to the global latch input, the latch output generates logic function of the logic output and the local input.

24 Claims, 5 Drawing Sheets

U.S. PATENT DOCUMENTS

| | | |
|---|---|---|
| 5,943,574 A | 8/1999 | Tehrani et al. |
| 5,944,813 A * | 8/1999 | Trimberger ............... 712/36 |
| 5,949,710 A | 9/1999 | Pass et al. |
| 5,949,719 A | 9/1999 | Clinton et al. |
| 6,005,806 A | 12/1999 | Madurawe et al. |
| 6,018,476 A | 1/2000 | Madurawe et al. |
| 6,097,211 A | 8/2000 | Couts-Martin et al. |
| 6,134,171 A | 10/2000 | Yamagata et al. |
| 6,134,173 A | 10/2000 | Cliff et al. |
| 6,191,614 B1 | 2/2001 | Schultz et al. |
| 6,242,767 B1 | 6/2001 | How et al. |
| 6,259,271 B1 | 7/2001 | Couts-Martin et al. |
| 6,262,596 B1 | 7/2001 | Schultz et al. |
| 6,265,923 B1 * | 7/2001 | Amir et al. ............... 327/218 |
| 6,275,064 B1 | 8/2001 | Agrawal et al. |
| 6,275,065 B1 | 8/2001 | Mendel |
| 6,331,784 B1 | 12/2001 | Mason et al. |
| 6,331,789 B2 | 12/2001 | Or-Bach |
| 6,337,579 B1 | 1/2002 | Mochida |
| 6,340,830 B1 | 1/2002 | Takemura |
| 6,353,562 B2 | 3/2002 | Bohm et al. |
| 6,420,925 B1 | 7/2002 | Fifield et al. |
| 6,426,649 B1 | 7/2002 | Fu et al. |
| 6,448,808 B2 | 9/2002 | Young et al. |
| 6,469,953 B1 * | 10/2002 | Hong ............... 365/230.08 |
| 6,480,027 B1 | 11/2002 | Ngai et al. |
| 6,496,887 B1 | 12/2002 | Plants |
| 6,504,742 B1 | 1/2003 | Tran et al. |
| 6,515,511 B2 | 2/2003 | Sugibayashi et al. |
| 6,525,953 B1 | 2/2003 | Johnson |
| 6,551,857 B2 | 4/2003 | Leedy |
| 6,582,980 B2 | 6/2003 | Feldman et al. |
| 6,613,611 B1 | 9/2003 | How et al. |
| 6,614,259 B2 | 9/2003 | Couts-Martin et al. |
| 6,627,985 B2 | 9/2003 | Huppenthal et al. |
| 6,737,675 B2 | 5/2004 | Patel et al. |
| 6,738,962 B1 | 5/2004 | Flaherty et al. |
| 6,798,240 B1 | 9/2004 | Pedersen |
| 6,812,731 B1 | 11/2004 | Trimbrger |
| 6,911,730 B1 | 6/2005 | New |
| 6,946,330 B2 | 9/2005 | Yamazaki et al. |
| 6,954,084 B2 | 10/2005 | Islam |
| 6,992,503 B2 | 1/2006 | Madurawe |
| 6,998,722 B2 | 2/2006 | Madurawe |
| 7,019,557 B2 | 3/2006 | Madurawe |
| 7,030,651 B2 | 4/2006 | Madurawe |
| 7,064,018 B2 | 6/2006 | Madurawe |
| 7,064,579 B2 | 6/2006 | Madurawe |
| 7,084,666 B2 | 8/2006 | Madurawe |
| 7,112,994 B2 | 9/2006 | Madurawe |
| 7,176,713 B2 | 2/2007 | Madurawe |
| 7,253,659 B2 | 8/2007 | Madurawe |
| 7,268,580 B2 | 9/2007 | Madurawe |
| 2001/0003428 A1 | 6/2001 | Or-Bach |
| 2001/0019155 A1 | 9/2001 | Warashina et al. |
| 2001/0028059 A1 | 10/2001 | Emma et al. |
| 2001/0047509 A1 | 11/2001 | Mason et al. |
| 2002/0177260 A1 | 11/2002 | Matsumoto |
| 2002/0186044 A1 | 12/2002 | Agrawal et al. |
| 2003/0001615 A1 | 1/2003 | Sueyoshi et al. |
| 2003/0023762 A1 | 1/2003 | Dhir et al. |
| 2003/0085733 A1 | 5/2003 | Pugh et al. |
| 2003/0227056 A1 | 12/2003 | Wang et al. |
| 2004/0178819 A1 | 9/2004 | New |
| 2005/0023656 A1 | 2/2005 | Leedy |
| 2006/0195729 A1 | 8/2006 | Huppenthal |

OTHER PUBLICATIONS

Alexander, et al., "Three-Dimensional Field-Programmable Gate Arrays", Proceedings of the $8^{th}$ Annual IEEE International ASIC Conference and Exhibit, 1995, pp. 253-256.

Chen Dong et al., "3-D nFPGA: A reconfigurable architecture for 3-D CMOS/Nanomaterial Hybrid Digital Circuits", IEEE Trans. Circuits and Systems, vol. 54, No. 11, Nov. 1, 2007 (pp. 2489-2501).

* cited by examiner

USING PROGRAMMABLE LATCH TO IMPLEMENT LOGIC

BACKGROUND

In electronics, a latch is a kind of bistable multivibrator, an electronic circuit which has two stable states and thereby can store one bit of information. Today the word is mainly used for simple transparent storage elements, while slightly more advanced non-transparent (or clocked) devices are described as flip-flops. Informally, as this distinction is quite new, the two words are sometimes used interchangeably.

When using static gates as building blocks, the most fundamental latch is the simple SR latch (or simple SR flip-flop), where S and R stand for set and reset. Other types include D, JK, T and Clocked Flip-Flops. It can be constructed from a pair of cross-coupled NAND (negative AND) and NOR (negative OR) type logic gates. The stored bit is present on the output marked Q. Normally, in storage mode, the S and R inputs are both low, and feedback maintains the Q and !Q outputs in a constant state, with !Q meaning the complement of Q. If S (Set) is pulsed high while R is held low, then the Q output is forced high, and stays high when S returns low; similarly, if R (Reset) is pulsed high while S is held low, then the Q output is forced low, and stays low when R returns low.

FIG. 1 shows an exemplary synchronous SR latch 10. The synchronous SR latch 10 (sometimes clocked SR flip-flop) can be made by adding a second level of NAND gates to the inverted SR latch (or a second level of NOR gates to the direct SR latch). The extra gates further invert the inputs so the simple SR latch becomes a gated SR latch (and a simple SR latch would transform into a gated SR latch with inverted enable). With E high (enable true) and with the correct clock C transition edge, the signals can pass through the input gates to the encapsulated latch. With E low (enable false) the latch is closed and remains in the state it was left the last time E was high and a rising edge of clock C, for example.

A circuit incorporating latches has state; its output may depend not only on its current input, but also on its previous inputs. Such a circuit is described as sequential logic. A plurality of latches is coupled to one or more global control signals to set, reset and clock storage data.

SUMMARY

In one aspect, a latch adapted to implement AND logic includes a storage element having an output reflecting a stored data state; a first logic input coupled to the storage element to store the data state; a global control signal coupled to the storage element to change the stored data state; and a second logic input programmably coupled to the global control signal to generate an AND output from the first and second logic inputs.

In another aspect, a method of adapting a latch to implement a logic function includes coupling a first logic input to an input of the latch used for storing a data state in the latch; and providing a configurable element to couple a second logic signal to a global control signal used for globally changing the stored data state in the latch, wherein, when the configurable element is programmed to couple the second logic input to the global control signal, the output generates a logic function of the first and second logic inputs.

In yet another aspect, a logic circuit includes a logic block comprising a plurality of logic inputs and at least one logic output, the logic output generating a logic function of the plurality of logic inputs; and a latch. The latch has a first latch input to store a data state coupled to said at least one output of logic block; a global latch input to change the stored data state of the latch couple by a programmable method to a local input; and a latch output, wherein when the local input is coupled to the global latch input, the latch output generates logic function of the logic output and the local input.

In yet another aspect, a programmable logic device, comprising: a programmable logic output of one or more primary programmable inputs; and a secondary programmable input; and a latch having the programmable logic output and the secondary programmable input coupled to the latch to generate a logic function of the primary and secondary inputs.

In yet another aspect, a method of using a latch to enhance logic capacity of a programmable logic circuit includes: storing a programmable logic circuit output in a latch; and programmably coupling a logic input to a latch global control signal such that the latch output generates a logic function of the programmable logic circuit output and the logic input.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
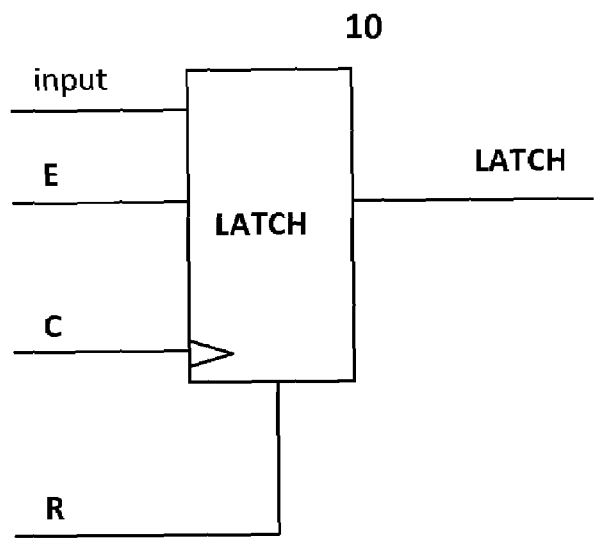
FIG. 1 shows a conventional latch.
Figure 2:
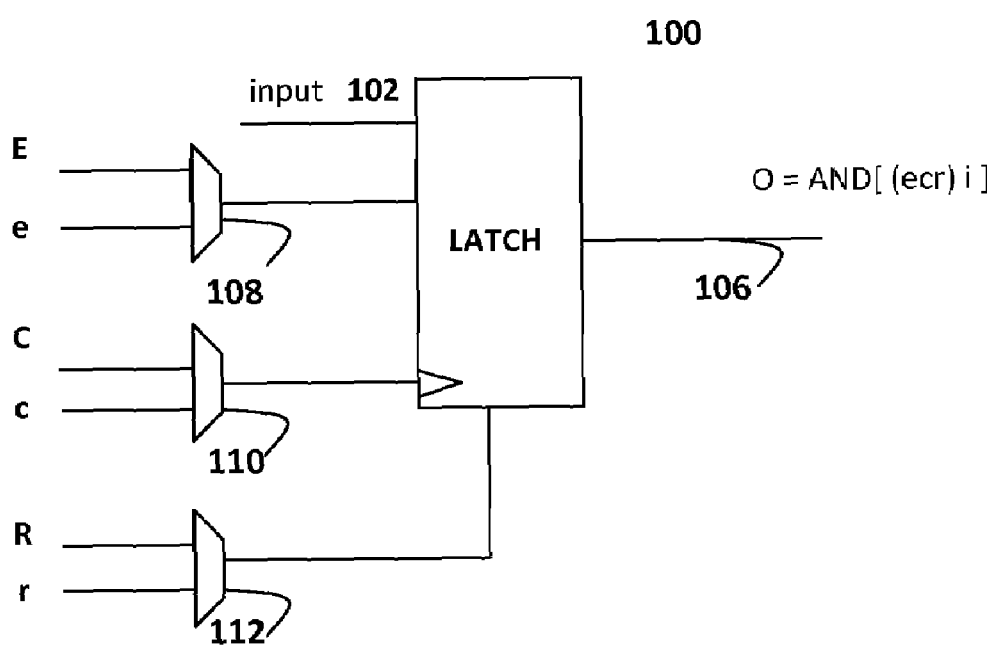
FIG. 2 shows an exemplary latch implementing logic functions.

Referring now to FIG. 2, an exemplary latch 100 implementing logic functions is shown. The latch 100 has an input 102 to receive and store input data based on the enable, clock and reset control signals. A multiplexer (mux) 108 receives a global enable signal E and a local enable signal e and the output of the mux 108 is provided to the enable control of the latch 100. Similarly, a multiplexer (mux) 110 receives a global clock signal C and a local clock signal c and the output of the mux 110 drives the clock input of the latch 100. Additionally, a multiplexer (mux) 112 receives a global reset signal R and a local reset signal r and the output of the mux 112 is provided to the reset control of the latch 100. The output 106 of the latch 100 is an AND function of the local signals e, c and r and the input 102. Input 102 may be an output of a programmable logic block, an output of a register or a global input signal.

Figure 3:
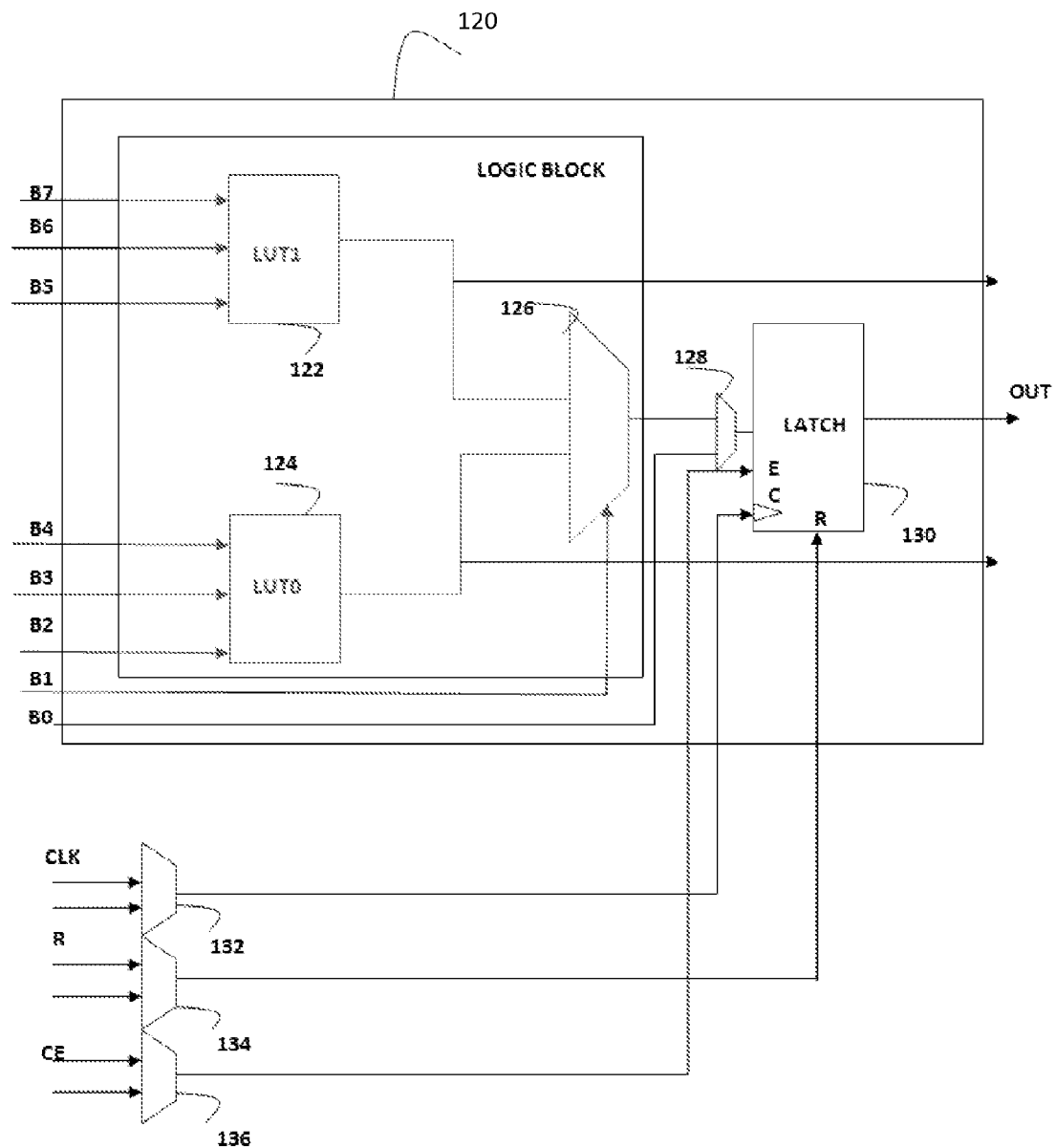
FIG. 3 shows an exemplary logic block based latch.

FIG. 3 shows an exemplary logic block based latch 120. In this latch, a look up table (LUT) 124 receives inputs B2, B3 and B4, respectively. Similarly, LUT 122 receives inputs B5, B6, B7. The outputs of the LUTs 122 & 124 are provided to a mux 126 which is controlled by input B1. The output of mux 126 is provided to another mux 128 which receives B0 at a second input. The output of the mux 128 is provided to the input of a latch 130.

Turning now to the control signals for the latch 130, a multiplexer (mux) 136 receives a global enable signal E and a local enable signal e and the output of the mux 136 is provided to the enable control of the latch 130. Similarly, a multiplexer (mux) 132 receives a global clock signal C and a local clock signal c and the output of the mux 132 drives the clock input of the latch 130. Additionally, a multiplexer (mux) 134 receives a global reset signal R and a local reset signal r and the output of the mux 134 is provided to the reset control of the latch 130. The output of the latch 130 is a logic function which in this embodiment is an AND of the local signals e, c and r and the inputs B0-B7. The local signals may be generated by other logic blocks such as LUT element 124.

Figure 4:
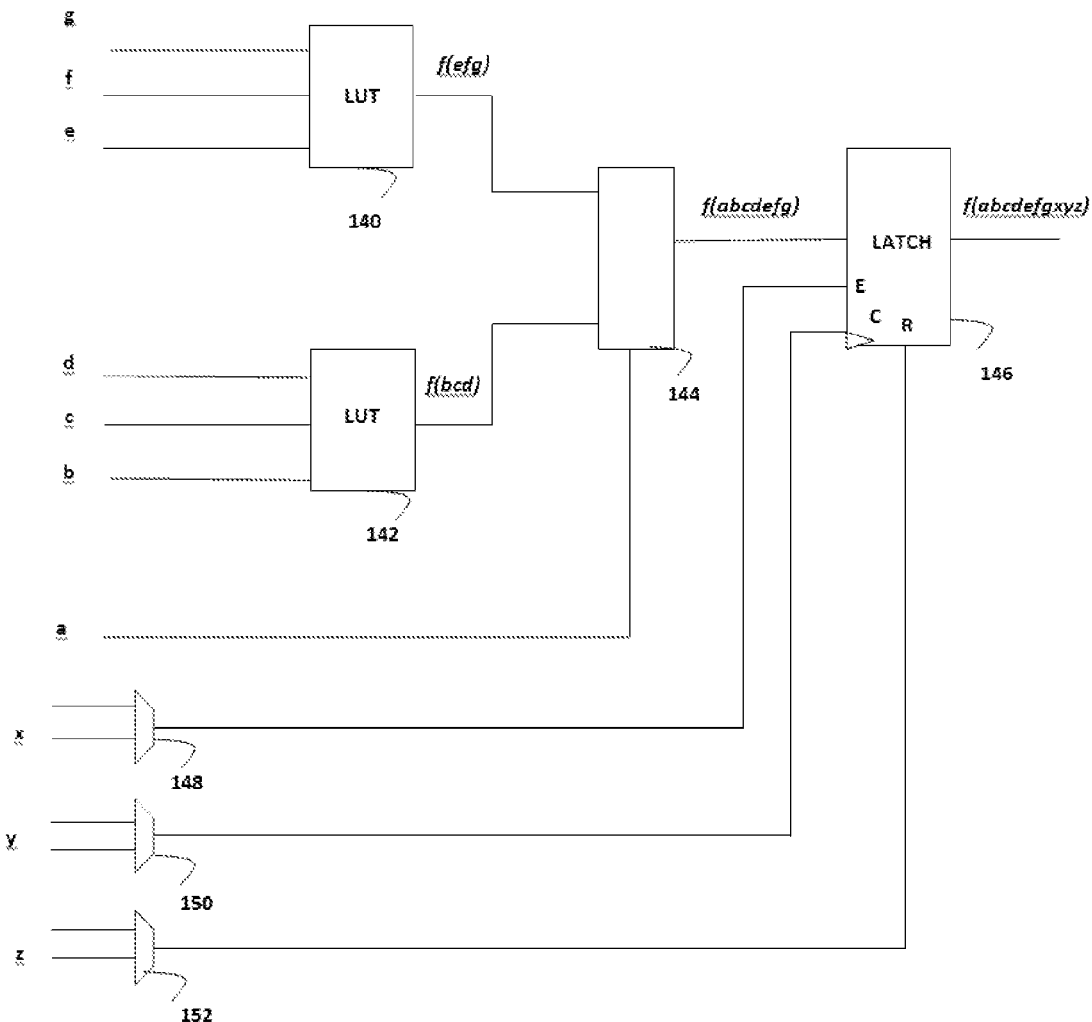
FIG. 4 shows an exemplary wide function logic block based latch.

FIG. 4 shows an exemplary wide function logic block based latch. An LUT 140 receives inputs e, f, and g and generates an output f(efg). Similarly, an LUT 142 receives inputs b, c, d and generates an output f(bcd). A logic unit 144 receives an input a and combines a with the outputs of LUTs 140 & 142 to generate an output f(abcdefg) and provides this output to the input of a latch 146.

A multiplexer (mux) 148 receives a global enable signal E and a local enable signal e and the output of the mux 148 is provided to the enable control of the latch 146. Similarly, a multiplexer (mux) 150 receives a global clock signal C and a local clock signal c and the output of the mux 150 drives the clock input of the latch 146. Additionally, a multiplexer (mux) 152 receives a global reset signal R and a local reset signal r and the output of the mux 152 is provided to the reset control of the latch 146. The output of the latch 146 is a wide logic function which in this case is an AND function f(abcdefgxyz).

Figure 5:
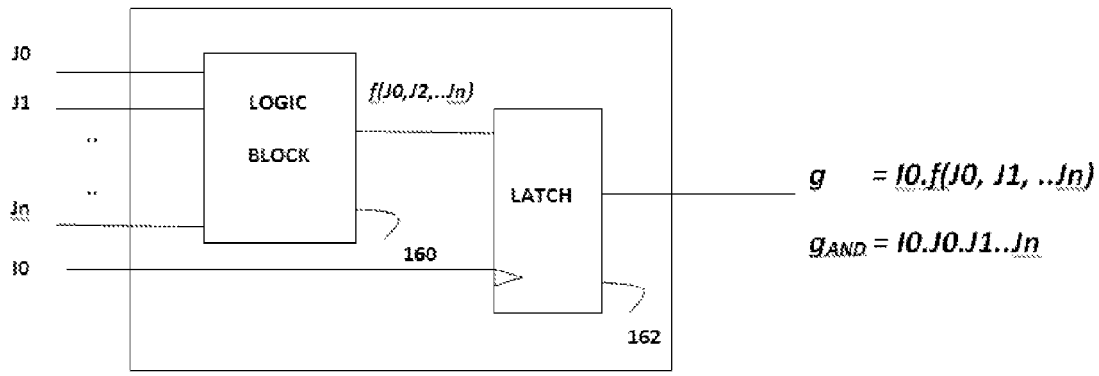
FIG. 5 shows a second exemplary wide function logic block based latch.

FIG. 5 shows a second exemplary wide function logic block based latch. In this example, logic block 160 receives inputs J0 . . . Jn and generates an output f(J0, J1, . . . Jn) which is connected to the input of a latch 162. The latch 162 is clocked by an input I0, and the output of the latch generates g=I0 AND f(J0, J1 . . . Jn). In another view, the latch 162 outputs $g_{AND}$=I0 AND J0 AND J1 . . . AND Jn.

Figure 6:
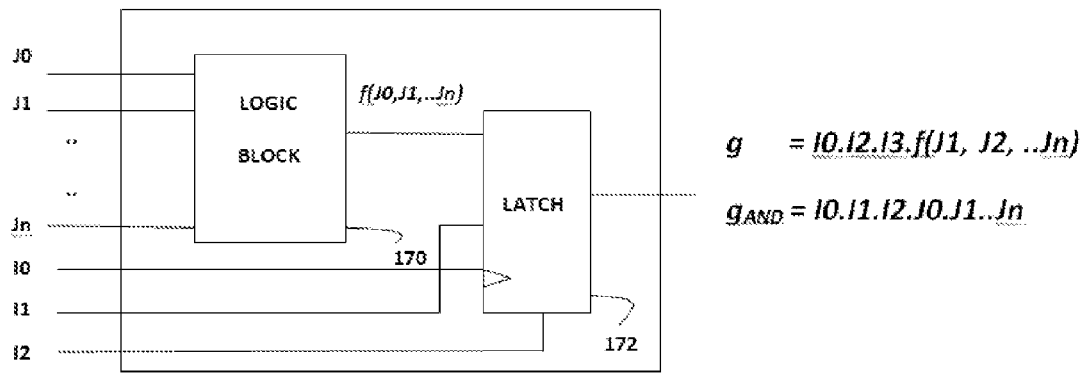
FIG. 6 shows a third exemplary wide function logic block based latch.

FIG. 6 shows a third exemplary wide function logic block based latch. The example of FIG. 6 provides reset and enable inputs in addition to the clock input to the latch. In this example, logic block 160 receives inputs J0 . . . Jn and generates an output f(J0, J1, . . . Jn) which is connected to the input of a latch 162. The latch 162 is clocked b an input I0, and the output of the latch is g=I0 AND f(J0 . . . Jn). Equivalently, the latch 162 outputs $g_{AND}$=I0 AND J0 AND J1 . . . AND Jn.

Figure 7:
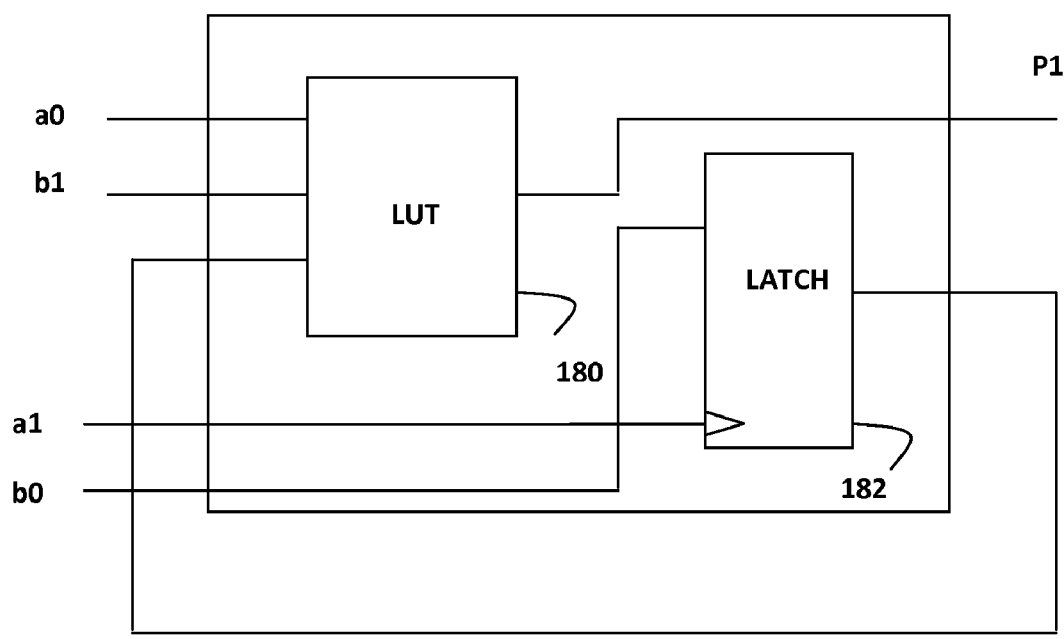
FIG. 7 shows an exemplary use of the latch implementing a multiplier function.

FIG. 7 shows an exemplary use of the latch implementing a multiplier function. The device of FIG. 7 multiplies two numbers a×b, each two bits wide as an example:

|    |      | a1   | a0   |
|----|------|------|------|
|    | ×    | b1   | b0   |
|    |      | a1b0 | a0b0 |
|    | a1b1 | a0b1 |      |
| P3 | P2   | P1   | P0   |

In FIG. 7, an LUT 180 receives a0 and b1 as inputs, while a latch 182 receives a1 and b0 as inputs. The output of the latch 182 is provided as an input to the LUT 180. The output of the LUT 180 is P1. In this example, a1b0 is determined by the latch 182, and the a1b0 is provided as an input to the LUT 180. The LUT 180 performs an AND operation on a0b1 and then adds the a1b0 to a1b0 as the output P1.

The latch may be an SRAM cell, or include an SRAM cell. One or more transistors of the latch may comprise thin film transistors constructed in a semiconductor thin film layer located substantially above logic transistors. The TFT transistors are buried above the logic gates of an Integrated Circuit to consume no extra Silicon real estate, as discussed in commonly owned United States Patent Applications 20040207100 and 20060146596, the contents of which are incorporated by reference. On or more transistors of the latch may be constructed in Silicon substrate layer adjacent to logic gates of an Integrated Circuit. One or more programmable inputs or outputs of the latch may be configured by TFT transistors and TFT memory devices located substantially above or below latch transistors.

In certain embodiments, the latch implementing logic functions can work with antifuses. The antifuse is suitable for virtually any integrated circuit where a fuse or antifuse is desirable to store permanent data. For example, the antifuse can be used as part of a generic integrated memory address circuit to select redundant rows or columns within a ROM, EEROM, PROM, flash RAM, or DRAM. In many embodiments, the integrated circuit is part of a larger system, such as computer system or more generally a computerized system including a microprocessor or digital signal processor coupled to the memory circuit. In addition to the antifuses, memory address circuit includes a set of address transistors, a set of redundant address transistors, and conventional laser fuses. Address transistors are conventionally used to address rows or columns in the memory array. Each row or column includes one or more memory cells. One or more of the above antifuses and one or more of laser fuses can be selectively programmed to replace one or more of memory rows or columns with redundant memory row or column. In some embodiments, one or more of the antifuses are programmed and one or more others remain unprogrammed, and in some embodiments all the antifuses are either programmed or unprogrammed.

The LUT can be circuits as disclosed in commonly owned United States Patent Applications 20070171105 and 20070035329, the contents of which are incorporated by reference. The LUT makes use of additional programmable elements inside the large LUT structure, enabling sub-division of LUTs. A complex design can be fitted as a single larger logic LUT or as many smaller logic LUT pieces: both maximizing the Silicon utilization. In the reference, a 2LUT divisible 4LUT macro-cell (shown in FIG. 16A) provides a 2× improvement in logic packing compared to hard-wired 4LUT logic elements. The increased memory content is justified by a 3-dimentional thin-film transistor module integration that allows all configuration circuits to be built vertically above logic circuits. These memory circuits contain TFT memory elements that control pass-gates constructed in substrate Silicon. The TFT layers are fabricated above a metal layer in a removable module, facilitating a novel method to remove completely from the process in preference to hard-wired replacements. Configuration circuits are mapped to a hard-wire metal links to provide the identical functionality in the latter. Once the programming pattern is finalized with the thin-film module, and the device is tested and verified for performance, the TFT cells can be eliminated by hard-wire connections. Such conversions allow the user a lower cost and more reliable end product. These products offer an enormous advantage in lowering NRE costs and improving TTS in the ASIC design methodology in the industry.

The latch can be used in a generic field programmable gate array (FPGA) or an application specific integrated circuit (ASIC). In both cases the logic content mapped to LUTs is further enhanced by creating larger logic functions including extra inputs and the latch. Thus less Si (hence cheaper) and faster logic computations are achieved by the disclosed latch logic mapping. Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A latch adapted to implement AND logic in a field programmable gate array (FPGA), comprising:
    a storage element having an output reflecting a stored data state;
    a first logic input coupled to the storage element to store the data state;
    a global control signal in the FPGA coupled to the storage element to change the stored data state; and
    a second logic input programmably coupled to the global control signal to generate an AND output from the first and second logic inputs,
    wherein the storage element comprises a latch with the AND output as part of the FPGA.

2. The latch of claim 1, wherein the storage element comprises a latch.

3. The latch of claim 2, comprising a multiplexer coupling the global control signal to the latch.

4. The latch of claim 3, comprising a local logic signal coupled to an input of the multiplexer.

5. The latch of claim 1, wherein the first logic input is an output generated by a programmable logic block.

6. The latch of claim 5, comprising a multiplexer coupled to the programmable logic block and the storage element.

7. The latch of claim 5, wherein the programmable logic block comprises one or more of: look-up-table (LUT), multiplexer circuit, NAND gate, NOR gate, AND gate, OR gate, XOR gate, product-term, register, processor, and Arithmetic-Logic-Unit.

8. A method of adapting a latch to implement a logic function, the method comprising:
    coupling a first logic input to an input of the latch used for storing a data state in the latch; and
    providing a configurable element to couple a second logic signal to a global control signal used for globally changing the stored data state in the latch, wherein, when the configurable element is programmed to couple the second logic input to the global control signal, the output generates a logic function of the first and second logic inputs.

9. The method of claim 8, wherein the logic function comprises one of: AND function, OR function, NAND function, NOR function, NOT function.

10. The method of claim 8, comprising multiplexing the global control signal to the latch.

11. The method of claim 10, comprising providing a local signal to an input of the multiplexer.

12. The method of claim 8, comprising coupling a logic block to the storage element.

13. The method of claim 12, comprising multiplexing the output of the logic block to the storage element.

14. The method of claim 12, comprising providing one or more of: look-up-table (LUT), multiplexer circuit, NAND gate, NOR gate, AND gate, OR gate, XOR gate, product-Term, register, processor, and Arithmetic-Logic-Unit.

15. A logic circuit, comprising:
    a logic block comprising a plurality of logic inputs and at least one logic output, the logic output generating a first logic function of the plurality of logic inputs; and
    a latch having:
        a first latch input to store a data state coupled to said at least one output of logic block;
        a global latch input to change the stored data state of the latch couple by a programmable method to a local input; and
        a latch output, wherein when the local input is coupled to the global latch input, the latch output generates a second logic function of the logic output and the local input.

16. The logic circuit of claim 15, wherein the logic function comprises one of: AND function, OR function, NAND function, NOR function, NOT function.

17. The logic circuit of claim 15, comprising a multiplexer coupling the global control signal to the latch.

18. The logic circuit of claim 17, comprising a local signal coupled to an input of the multiplexer.

19. The logic circuit of claim 15, comprising a logic block coupled to the latch.

20. The logic circuit of claim 19, comprising a multiplexer coupled to the logic block and the storage element.

21. The logic circuit of claim 19, wherein the logic block comprises one or more of: look-up-table (LUT), multiplexer circuit, NAND gate, NOR gate, AND gate, OR gate, XOR gate, product-term, register, processor, and Arithmetic-Logic-Unit.

22. The logic circuit of claim 19, wherein the latch output generates a logic function of the logic block output and one or more latch inputs.

23. The logic circuit of claim 22, wherein the logic function comprises an AND operation.

24. A programmable logic device, comprising:
    a programmable logic output of one or more primary programmable inputs; and a secondary programmable input; and
    a latch having the programmable logic output and the secondary programmable input coupled to the latch to generate a logic function of the primary and secondary inputs.

* * * * *